United States Patent [19]

Gallant et al.

[11] 3,727,139

[45] Apr. 10, 1973

[54] VOLTAGE SUPPLY FOR VOLTAGE VARIABLE CAPACITOR DIODE TUNING

[75] Inventors: Stuart L. Gallant, Philadelphia, Pa.; John W. Waring, Palmyra, N.J.

[73] Assignee: Philco-Ford Corporation, Philadelphia, Pa.

[22] Filed: Aug. 10, 1971

[21] Appl. No.: 170,591

[52] U.S. Cl. ....................325/453, 325/468, 321/16, 331/183, 334/15

[51] Int. Cl. ..............................................H04b 1/26

[58] Field of Search............................321/2, 16, 18; 325/452, 453, 464, 468; 331/183; 334/15

[56] References Cited

UNITED STATES PATENTS

| | | | |
|---|---|---|---|
| 3,657,654 | 4/1972 | Friberg | 325/452 |
| 3,638,096 | 1/1972 | Judd et al. | 321/2 X |
| 3,500,265 | 3/1970 | Klettke | 334/15 |
| 3,249,876 | 5/1966 | Harrison | 325/453 |

*Primary Examiner*—Benedict V. Safourek
*Attorney*—Robert D. Sanborn

[57] ABSTRACT

An oscillator is amplitude stabilized by means of a high gain feedback loop and is used to apply an a-c signal to a variable-inductor voltage divider. The divider output, which has an amplitude proportional to the magnitude of inductance, is rectified and filtered to produce a d-c voltage that is used to tune the voltage variable capacitor elements of a radio receiver tuner. Thus voltage variable capacitor tuning is accomplished by means of a variable inductor transducer.

9 Claims, 2 Drawing Figures

INVENTORS
STUART L. GALLANT
JOHN W. WARING
BY Gail W. Woodward
AGENT

VOLTAGE SUPPLY FOR VOLTAGE VARIABLE CAPACITOR DIODE TUNING

BACKGROUND OF THE INVENTION

A voltage variable capacitor (VVC) is one that changes capacitance as a function of applied voltage. Semiconductor diodes have a capacitance associated with their physical structure that varies with applied voltage. In the reverse-biased direction very little power is required for the capacitance control function. The capacitance is of high Q and can be varied over wide limits with relatively small voltage variation. In addition the diodes can be made very small and rugged, are not subject to mechanical or microphonic problems, and are extremely reliable. The development of low-cost electrically-acceptable diodes has led to their use in a wide variety of consumer products. Since the diode capacitance is varied by means of an applied voltage the mechanical tuning function is separated from the actual device. This permits optimizing the physical placement of the tuning element electrically and then locating the mechanical tuning element where desired.

Ordinarily the mechanical tuning function is accomplished with a potentiometer that is connected across a source of constant d-c voltage. The arm of the potentiometer then provides a d-c voltage that is varied mechanically by potentiometer rotation. The variable voltage is transferred over an interconnecting wire to the VVC. In order to stabilize the tuning system a well regulated source of d-c voltage is supplied to the potentiometer. This is necessary to avoid tuning or drift problems associated with source variations or variations caused by fluctuating load conditions. In a typical FM tuner using VVC tuning, it has been found that the tuning voltage should not vary more than 0.005 volt at any setting as a consequence of supply variations. This condition is particularly difficult to meet in automobile radios where the power supply variations run between 11 and 16 volts depending on the conditions of the battery, voltage regulator, alternator, and engine speed.

In addition, it is not a simple matter to incorporate a potentiometer into the tuning mechanisms currently employed in automobile radios. Instead of a potentiometer, it would be desirable to use some alternative device that could more easily be associated with currently accepted tuning mechanisms. Furthermore, potentiometers are well known for their tendency to generate noise when being adjusted, and, after being used for a period of time, tend to develop erratic output versus position characteristics.

SUMMARY OF THE INVENTION

It is an object of the invention to provide a d-c voltage that can be varied by means of a variable inductor and is independent of power supply variations.

It is a further object to provide a variable d-c voltage, suitable for use with VVC radio receiver tuning, that is particularly adapted for use in automobile radios.

It is a feature of the invention to employ, as the sole movable element of the FM tuner in an AM/FM radio, a variable inductor of the same type used in the AM tuner and driven by said AM tuner.

These and other objects and features are achieved by making the variable inductor a part of a voltage divider comprising at least one other inductor. The voltage divider is made part of the tuned circuit of an oscillator. The oscillator output is peak rectified and applied to a d-c amplifier that contains a voltage reference. The output of the d-c amplifier is applied to the oscillator so as to compensate any variation in amplitude. This action stabilizes the oscillator amplitude against supply voltage variations. An output of the inductive voltage divider is peak rectified and filtered to provide a d-c voltage that is a function of the value of the variable inductor. This voltage is suitable for VVC tuning.

In one embodiment the variable inductor is similar to those employed in the AM tuning portion of an automobile radio. It can be incorporated as an additional permeability tuned coil in the conventional tuning mechanism which couples to the tuning indicator dial. The variable voltage, generated as described above, is then used in conventional manner to tune the VVC tuned FM front end circuits including the local oscillator, antenna, and converter.

DESCRIPTION OF THE INVENTION

Figure 1:
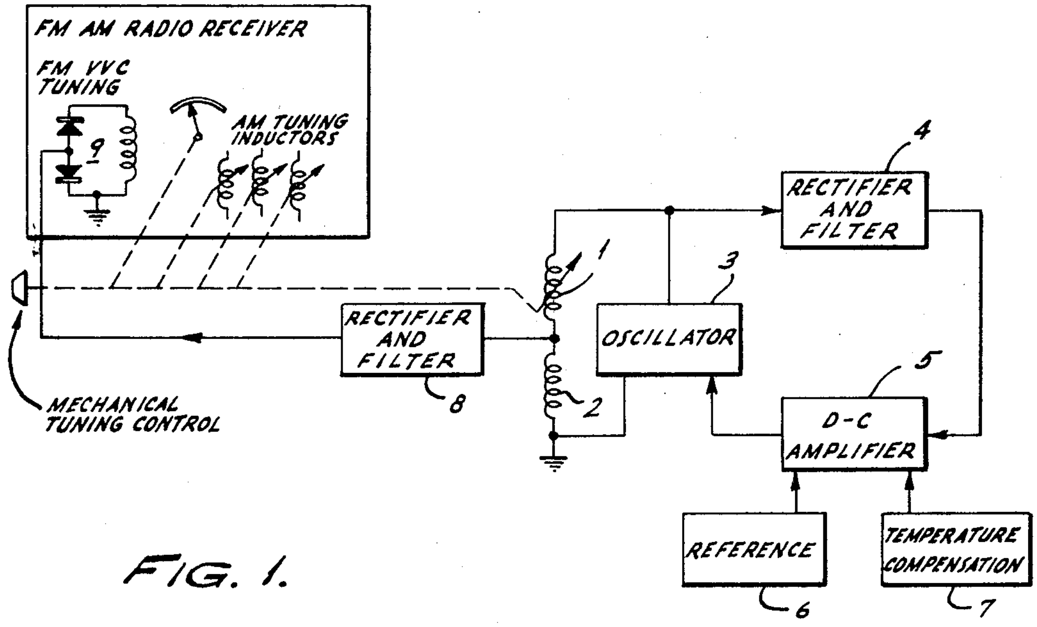
FIG. 1 is a partial schematic and block diagram showing the elements of the invention.

In FIG. 1 variable inductor 1, which is varied by a mechanical linkage from the receiver tuning mechanism, in conjunction with fixed inductor 2 form an a-c voltage divider. The divider is made part of the resonant circuit of oscillator 3 which generates an a-c voltage that appears across the divider. This voltage is peak detected by a rectifier and filter combination 4 to provide a d-c voltage equal to the peak a-c voltage in the oscillator. This voltage is fed to a d-c amplifier 5 that contains a voltage reference 6. The output of the d-c amplifier is used to control oscillator 3 so that the amplitude of oscillation is fixed with respect to reference 6. This renders the circuit insensitive to power supply variations. Temperature compensator 7 may be used if desired to control the circuit sensitivity to temperature. The output of the voltage divider is converted to direct current by peak rectifier and filter 8. The output of device 8 is a d-c voltage whose magnitude is dependent on the adjustment of inductor 1, but is substantially independent of power supply variations. Therefore, this latter output is suitable for controlling the frequency of VVC tuned circuits 9 which are employed in conventional manner to tune the FM portion of the AM/FM receiver.

Figure 2:
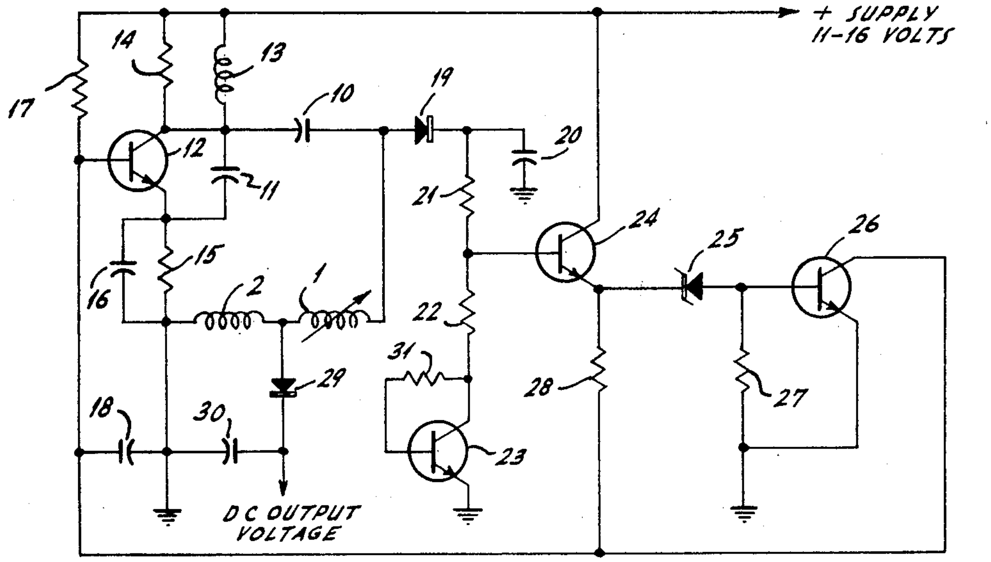
FIG. 2 is a schematic diagram showing the preferred electronic circuit.

In FIG. 2 the voltage divider comprising variable inductor 1 and fixed inductor 2 are part of a resonant circuit tuned mainly by capacitors 10, 11 and 16. Transistor 12 is connected as a Colpitts oscillator with inductor 13 and resistor 14 providing shunt collector feed. Resistor 15 provides emitter bias. Capacitor 16 is the oscillator feedback capacitor. Resistor 17 is the base bias supply resistor bypassed by capacitor 18.

Diode 19 and capacitor 20 peak rectify the oscillator output to produce a positive voltage equal to the amplitude of oscillation. The voltage divider comprising resistors 21 and 22 along with the collector circuit of transistor 23 apply a fraction of the rectified oscillator voltage to the base of transistor 24, which, together with transistor 26 and their associated circuits, comprise the d-c amplifier 5 of FIG. 1. Zener diode 25 provides the reference voltage for the d-c amplifier. It places the emitter of transistor 24 a fixed voltage above the base of transistor 26 whose emitter is returned to ground. Enough current flows in the emitter of transistor 24 and hence the zener diode to bias the diode into the flat and therefore stable portion of its operating curve. The current that flows in the base of transistor 26 will be a function of the relationship between the voltage characteristic of the zener diode and the oscillator amplitude. Resistor 27 conducts a portion of the zener diode current, the remainder of which flows from the base of transistor 26. The output of transistor 26 is connected to the base of oscillator transistor 12 and thereby controls the oscillation amplitude.

Oscillation amplitude control operates in the following manner. If the supply voltage increases, the oscillator amplitude will tend to increase thereby driving the base of transistor 24 more positive. This will drive the base of transistor 26 more positive and its collector less positive. This reduces the base voltage on transistor 12 and thus counters the tendency of the oscillations to increase.

Diode 29 and capacitor 30 form the rectifier 8 of FIG. 1 that provides a positive output voltage that can be varied by varying inductor 1 and is suitable for tuning one or more VVC tuned circuits.

The main feedback in the circuit by way of the collector of transistor 26 is to stabilize oscillator amplitude and would be considered negative feedback in the control loop. Resistor 28 provides a small amount of feedback that is positive and tends to destabilize the oscillator. This feedback counteracts a disadvantageous characteristic of the emitter-base circuit of transistor 26 as follows. Ideally the reference voltage produced by zener diode 25 is a constant. However the actual voltage at the emitter of transistor 24 is the sum of the zener diode voltage and the emitter to base voltage of transistor 26. Since this emitter to base voltage varies with current, it will disturb the value of reference voltage. Resistor 28 provides a feedback that offsets the emitter-base voltage variation with current in transistor 26.

Transistor 23 with its base resistor 31 temperature compensates the d-c amplifier in a manner well known in the art. As temperature variations modulate the emitter-base current characteristics of transistor 23, the variation is multiplied by the transistor gain to appear at the collector as a variable voltage connected into the circuit so as to offset the effect of a change in temperature. The degree of compensation is a function of resistors 22 and 31.

When the circuit of FIG. 2 was employed with the component values listed in the following chart, the maximum variation in d-c output voltage was less than 0.002 volt when the supply was varied from 11 to 16 volts.

| | |
|---|---|
| Inductor **1** | Variable 35 to 440 microhenries |
| Inductor **2** | 35 microhenries |
| Capacitor **10** | 390 picofarads |
| Capacitor **11** | 1200 picofarads |
| Transistor **12** | Silicon NPN 2N3845A |
| Inductor **13** | 2.5 millihenries |
| Resistor **14** | 1.5 K ohms |
| Resistor **15** | 100 ohms |
| Capacitor **16** | 0.1 microfarad |
| Capacitor **18** | 0.15 microfarad |
| Diode **19** | Germanium 1N60 |
| Capacitor **20** | 0.068 microfarad |
| Resistor **21** | 24.4 K ohms |
| Resistor **22** | 13.8 K ohms |
| Transistor **23** | Silicon NPN 2N3845A |
| Transistor **24** | Silicon NPN 2N5232 |
| Diode **25** | 7.5 volt zener 1N958B |
| Transistor **26** | Silicon NPN 2N3856A |
| Resistor **27** | 6.8 K ohms |
| Resistor **28** | 3.3 K ohms |
| Diode **29** | Germanium 1N60 |
| Capacitor **30** | 0.068 Microfarad |
| Resistor **31** | 4.7 K ohms |

The circuit shown and described produces excellent results but it has been noted that there is, in some instances, a tendency to produce parasitic harmonic radiation. This tendency is due in part to the excellent performance of modern transistors. If such radiation occurs in the FM band, the effect can be to cause excessive quieting at particular dial settings. This condition can be corrected, or at least reduced to an acceptable minimum, by connecting a resistor across inductor 2. A value of 2.2K ohms has proven suitable.

While the invention is well suited to VVC tuning applications it has value in any application where a voltage varying as a function of a mechanical input is desired. The variable inductor is shown as part of the oscillator frequency determining circuit. If desired the oscillator could be constructed separately or some other source of a-c voltage susceptible of amplitude control used, and the signal coupled separately to the voltage divider. Also while the control is shown in terms of a single variable inductor, the input could be in the form of a bank of pushbutton selected inductors. The scope of the invention is intended to be limited only the following claims.

We claim:

1. An electronic circuit for producing an electrical output that is a function of the value of a variable inductive element comprising:

a. a fixed inductor connected to said variable inductive element to form a variable inductive voltage divider, b. an oscillator having input and output terminals, said output terminals connected to apply an a-c voltage to said divider, said fixed inductor together with said variable inductive element forming a part of the frequency-determining resonant circuit of said oscillator, c. negative feedback means connected between said output and said input terminals of said oscillator to render the amplitude of oscillation of said oscillator substantially constant and independent of the value of said variable inductive element over the range of said variable inductive element, d. means for varying said variable inductor, and e. means for utilizing the electrical output of said divider.

2. The circuit of claim 1, wherein said variable inductive voltage divider comprises substantially the entire inductive portion of the frequency-determining resonant circuit of said oscillator.

3. The circuit of claim 1 wherein said feedback means comprise:

a. means for producing a d-c voltage proportional to the amplitude of said oscillator, b. means for producing a d-c reference voltage, and c. amplifying means connected to control the amplitude of said oscillator to maintain a constant relationship between the voltages of (a) and (b).

4. The circuit of claim 1 wherein said inductive element comprises one of a plurality of different value inductors, said one being selected in response to a mechanical action.

5. A device for producing a d-c voltage that is a function of the setting of a mechanically operated dial comprising:

a. a variable inductance voltage divider operated from said dial, b. an oscillator having input and output terminals, said output terminals connected to apply an a-c signal to said divider, c. negative feedback means connected between said output and said input terminals of said oscillator to stabilize the amplitude of oscillation of said oscillator, and d. rectifying and filter means connected to the output of said divider to produce a d-c voltage proportional to the setting of said dial.

6. The device of claim 5 wherein said dial is associated with a radio receiver and said d-c voltage tunes the radio receiver.

7. The device of claim 6 wherein said variable inductance voltage divider incorporates a variable inductor of the kind used in the AM portion of said radio receiver and said d-c voltage tunes the FM portion of said radio receiver.

8. In an AM/FM radio receiver of the type employing a bank of ganged variable inductors the inductance values of which are mechanically adjusted in response to adjustment of the receiver tuning dial to effect tuning of stations in the AM band, and also employing a plurality of voltage variable capacitors to effect tuning of stations in the FM band, the improvement comprising:

a. an additional variable inductor ganged with said bank of inductors and adjustable therewith, b. an oscillation generator having as elements of its frequency-determining circuit the series combination of a fixed inductor and said additional variable inductor, said series combination constituting an inductive voltage divider an output of which is an oscillation whose amplitude varies as a function of the adjustment of said tuning dial, c. means for developing a unidirectional voltage whose magnitude is proportional to the amplitude of said oscillation, and d. means applying said unidirectional voltage to said voltage variable capacitors whereby to effect tuning of said receiver FM band in response to adjustment of said tuning dial.

9. The receiver of claim 8 including means for rendering the amplitude of said oscillation generator substantially constant.

* * * * *